Figure 1A:
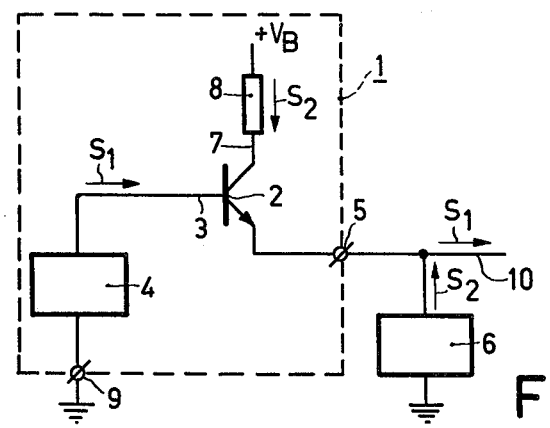

United States Patent [19]

van Straaten

[11] 4,173,769

[45] Nov. 6, 1979

[54] CIRCUIT ARRANGEMENT A PORTION OF WHICH IS INCLUDED WITHIN IN A MONOLITHIC INTEGRATED SEMICONDUCTOR BODY

[75] Inventor: Jan van Straaten, Nijmegen, Netherlands

[73] Assignee: U.S. Philips Corporation, New York, N.Y.

[21] Appl. No.: 868,977

[22] Filed: Jan. 12, 1978

[30] Foreign Application Priority Data

Jan. 27, 1977 [NL] Netherlands ........................ 7700809

[51] Int. Cl.$^2$ ............................................. H04N 9/46
[52] U.S. Cl. ...................................... 358/20; 307/237
[58] Field of Search ........................ 358/20, 153, 154; 307/237, 261, 268, 270

[56] References Cited

U.S. PATENT DOCUMENTS

| | | | |
|---|---|---|---|
| 3,789,141 | 1/1974 | Ayaki et al. | 358/20 |
| 3,902,077 | 8/1975 | Takemura et al. | 307/237 |

*Primary Examiner*—Richard Murray
*Attorney, Agent, or Firm*—Thomas A. Briody; William J. Streeter; Edward W. Goodman

[57] ABSTRACT

A circuit a portion of which is included within an integrated semiconductor body, with which a first signal can be derived from the body through a connecting terminal thereof while a second signal can be supplied thereto through the same connecting terminal. It can be used as a generator for producing a pulse for keying out the color synchronization signal in a color television receiver.

15 Claims, 8 Drawing Figures

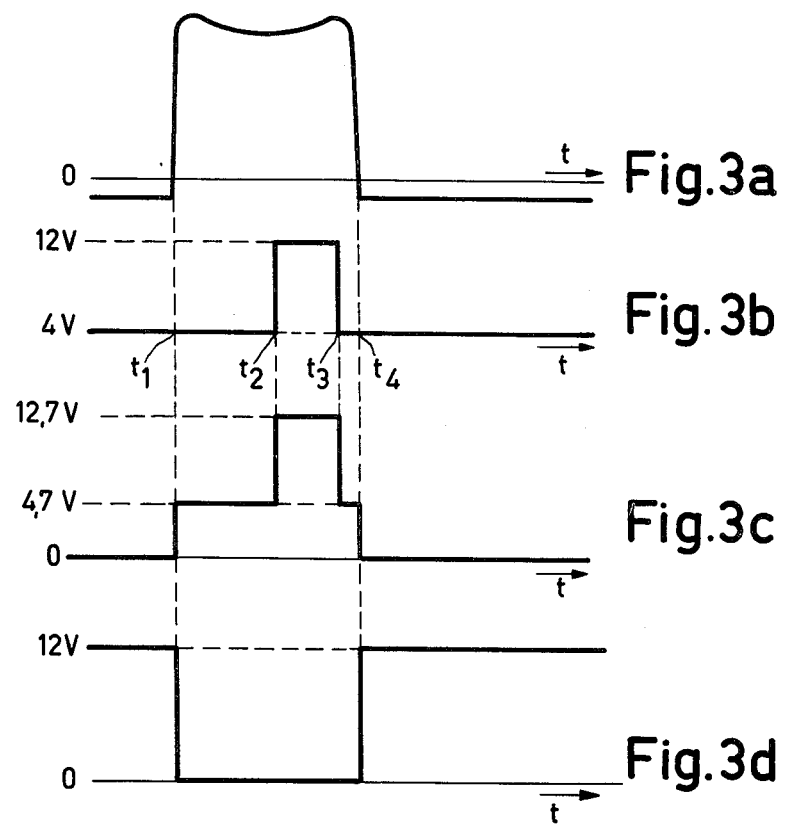
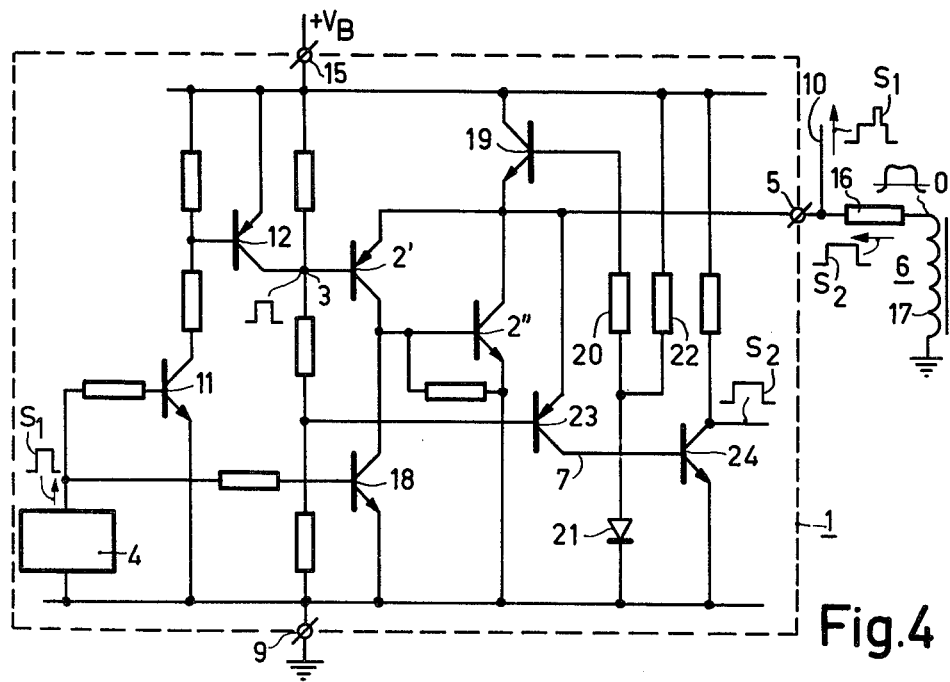

CIRCUIT ARRANGEMENT A PORTION OF WHICH IS INCLUDED WITHIN IN A MONOLITHIC INTEGRATED SEMICONDUCTOR BODY

The invention relates to a circuit arrangement a first portion of which is included within a monolithic integrated semiconductor body whilst a second portion is disposed outside said body.

As known such a semiconductor body comprises a great number of elements, for example transistors, diodes and resistors. In recent times this number has become so great that the cost of the body is hardly determined thereby. More transistors are even integrated in the body than are apparently necessary, for example to obtain a better temperature stabilization or because it is often easier to integrate a transistor than a resistor. On the other hand the number of connecting terminals with which circuits which are located within the body are connected to external components or leads are limited and determine the cost. Consequently, the designer will aim at reducing this number, which will often advantageously reduce the number of external components.

The invention has for its object to realize a circuit arrangement wherein one and the same connecting terminal can perform two functions and to this end the circuit according to the invention is characterized in that for deriving from said body a signal present within said first circuit portion through a connecting terminal of said body and supplying another signal from said second circuit portion to said body through the same connecting terminal, one of the portions of the circuit comprises an amplifier having first, second and third terminals, said first terminal constituting an input terminal for one of the signals, said second terminal constituting an input terminal for the second signal and also an output terminal for the first signal, which second terminal is connected to said connecting terminal of the semiconductor body, whilst said third terminal constitutes an output terminal for the second signal.

Figure 1B:
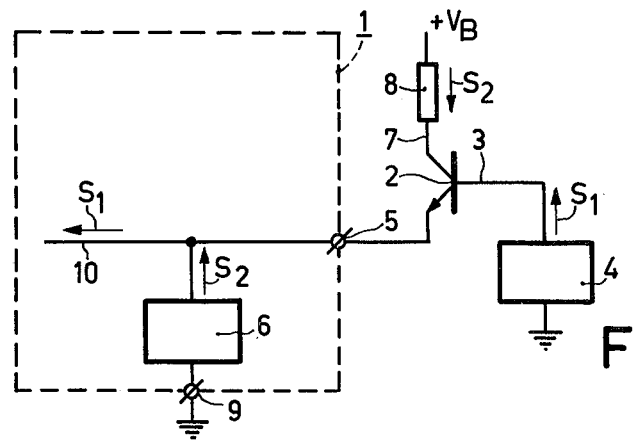
Figure 2:
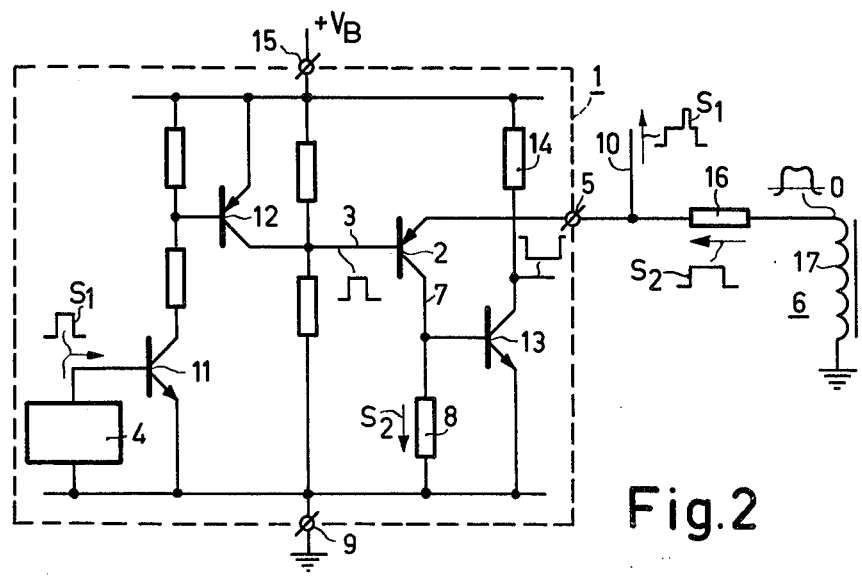

The invention will be further explained by way of non-limitative example with reference to the accompanying figures wherein:

FIGS. 1a and 1b show a first embodiment of the circuit arrangement according to the invention, FIG. 2 shows a second embodiment thereof, FIGS. 3a–3d show waveforms occurring therein, and FIG. 4 shows a more elaborate construction of the circuit arrangement of FIG. 2.

In FIG. 1a reference 1 represents a monolithic semiconductor body in which a plurality of circuits are integrated. One of these circuits comprises a transistor 2 of the npn-type whose base electrode 3 is supplied with a signal $S_1$ supplied by a signal source 4. The emitter electrode of transistor 2 is connected to a connecting terminal 5 of the body 1, to which terminal 5 a signal source 6, which is located outside body 1 is connected and which supplies a signal $S_2$. The collector electrode 7 of the transistor 2 is connected through a resistor 8 to a supply source which supplies a D.C. voltage $+V_B$. The non-active terminal of both sources 4 and 6 is grounded, that is to say in the case of source 4 that the relevant terminal thereof is connected to a grounded connecting terminal 9 of body 1.

In operation transistor 2 operates for signal $S_1$ as an emitter follower and signal $S_1$ is available on a lead 10 which is connected to terminal 5 and to external circuits (not shown). For signal $S_2$ transistor 2 operates in a grounded-base configuration, so that signal $S_2$ causes at the emitter only a small voltage drop. The collector current of transistor 2 flows through resistor 8. This current comprises a component which depends on signal $S_2$ so that this signal is available at electrode 7, for example in the form of a voltage. It will be clear to one skilled in the art that transistor 2 must be adjusted in a suitable manner and that the internal impedance of the signal sources must satisfy given conditions for a given result. If, for example, source 6 has a sufficiently high internal impedance to be considered as a current source, whereas source 4 has a sufficiently low internal impedance to be considered as a voltage source then the two signals do not substantially affect one another and the collector current does not contain signal $S_1$. This may be desirable in given circumstances. From the foregoing it appears that electrode 3 is an input for transistor 2 for signal $S_1$ whereas terminal 5 is an input for signal $S_2$ and an output for $S_1$ and that electrode 7 is an output for signal $S_2$, terminal 5 being at the same time a connecting terminal of body 1.

FIG. 1b shows a circuit arrangement for which signal source 4 is located outside body 1 whereas signal source 6 is included within this body. By means of an external transistor 2 it can be achieved in a similar manner as in FIG. 1a that a connecting terminal 5 of body 1 can function for supplying the signal $S_1$, produced by source 4, to the body as well as for deriving herefrom the signal $S_2$ produced by source 6. It should be noted that in FIG. 1a as well as in FIG. 1b no special requirements are imposed on the form of signals $S_1$ and $S_2$, so that the circuit according to the invention is suitable for both analog and digital signals.

FIG. 2 shows a circuit in which the preceding is applied. Herein reference 1 represents a semiconductor body which processes synchronization signals in a colour television receiver. Applied to an input terminal (not shown) of body 1 a detected video signal is supplied which originates from the receiving section of the receiver. This video signal is processed in such a manner that at output terminals of body 1 signals are available which can be supplied to amplifiers for the horizontal and vertical deflection as well as to colour processing stages.

In FIG. 2 signal source 4 produces a positive-going pulse-shaped signal $S_1$ which must ensure keying out of a colour synchronisation signal. Such a source is known per se and is disclosed, for example, in U.S. patent application Ser. No. 727,714, filed Sept. 29, 1976, now abandoned in favor of Ser. No. 946,971, filed Sept. 28, 1978. The leading edge of this pulse occurs in the synchronized state a short period of time after the occurrence of the trailing edge of the line synchronization pulse whereas the trailing edge thereof occurs a short period of time before the occurrence of the trailing edge of the line blanking pulse. Pulse $S_1$ can also be used for determining the black level. Through two transistor amplifiers 11 and 12 signal $S_1$ is applied to the base electrode 3 of transistor 2. In FIG. 2 corresponding reference numerals indicate the same components as in FIG. 1a.

In this embodiment the transistor 2 is of the pnp-type. Resistor 8, whose other end is grounded through terminal 9 and the base of an npn-transistor 13 are connected to the collector electrode 7 of this transistor 2. The collector resistor 14 thereof is connected just like one of the base bias resistors of transistors 12 and 2 to the connecting terminal 15 of a body 1 which is connected to supply source +$V_B$, whilst the emitter of transistor 13 is connected to earth terminal 9.

Connected to connecting terminal 5 of body 1, which is connected to the emitter electrode of transistor 2, a resistor 16 is connected outside body 1, the other end of this resistor being connected to a winding 17 of a line output transformer. In operation positive going line flyback pulses are present across this winding.

Prior to the occurrence of pulse $S_1$ a bias voltage of, for example, 4 V is present on electrode 3. Transistor 2 does not carry current. At an instant $t_1$ the leading edge, which is assumed to be very steep, of a line flyback pulse occurs which pulse is plotted versus time in FIG. 3a. After a very short period of time the voltage across winding 17 exceeds the value of approximately 4.7 V for which transistor 2 is conducting. A current which is, consequently, the signal $S_2$ flows through resistor 16, whilst winding 17 and resistor 16 together constitute signal source 6. The voltage at terminal 5 (see FIG. 3c) retains after instant $t_1$ at the value of approximately 4.7 V.

At an instant $t_2$ which is located, in the synchronized state of the line synchronization circuits approximately 7 μs, after instant $t_1$, the leading edge of pulse $S_1$ occurs. Transistors 11 and 12 conduct and the voltage at electrode 3 increases very rapidly to approximately the value of the voltage $V_B$, being, for example, 12 V (see FIG. 3b). If the pulse of FIG. 3a has an amplitude which exceeds approximately 12.7 V then transistor 2 remains conducting and the voltage at terminal 5 increases to this value after instant $t_2$. At an instant $t_3$, approximately 4 μs after instant $t_2$, the trailing edge of pulse $S_1$ occurs. The voltage at electrode 3 again assumes the value of 4 V whereas the voltage at the terminal 5 again assumes the value of approximately 4.7 V. At instant $t_4$ at approximately 12 μs after instant $t_1$ the trailing edge of the flyback pulse is produced and transistor 2 is cut-off.

The pulse (see FIG. 3c) obtained at the terminal 5 occurs substantially simultaneously with pulse $S_1$ and which is available at a lead 10 which is connected outside the body 1 to terminal 5. This pulse can be applied to colour processing stages (not shown) for keying out the colour synchronization signal and for clamping the black level in the colour signals which are obtained after demodulation. A pulse formed by the edges occurring at instants $t_1$ and $t_4$ may be used for suppressing the signal of video frequency, during the line flyback period, both in the luminance and in the chrominance section of the receiver. This, however, is not essential as also the line flyback pulse is suitable for that purpose.

From the foregoing it appears that the collector current of transistor 2 flows between instants $t_1$ and $t_4$. Consequently, this current gives the same information as the flyback pulse and is therefore equal in duration to the above-mentioned signal $S_2$. Also transistor 13 conducts between instants $t_1$ and $t_4$ so that the pulse shown in FIG. 3d is available at its collector. This pulse can be used as a reference signal for a line synchronisation circuit disposed in the body 1.

FIG. 4 shows a more elaborate construction of the circuit of FIG. 2, wherein the same components have been given the same reference numerals. A greater current gain factor is obtained by replacing, relative to FIG. 2, transistor 2 by the combination of a pnp-transistor 2' and an npn-transistor 2", the collector of transistor 2' being connected to the base of transistor 2" and the collector of transistor 2" to the emitter of transistor 2'. As known this combination behaves as a pnp-transistor whose emitter is formed the lastmentioned connection and is connected to terminal 5 whilst the collector is formed by the emitter of transistor 2" and is connected to earth terminal 9. An improved steepness is obtained for the edges of the pulses owing to the fact that the first mentioned connection is connected to the collector of a transistor 18 whose emitter is grounded and which is made conductive by pulses $S_1$.

In a similar manner as in FIG. 2 the pulse of FIG. 3c is produced at terminal 5. Because the voltage across winding 17 is negative before instant $t_1$ and after instant $t_4$, the voltage at terminal 5 would also be negative if no further measures were taken. This is prevented due to an npn-transistor 19 whose emitter is connected to terminal 5 and whose collector is connected to terminal 15 whilst its base is connected, through a resistor 20, to the anode of a diode 21 one terminal of which is grounded, the diode always being kept in the conductive state by the current flowing through a resistor 22 which is included between the anode and terminal 15. If the voltage at terminal 5 is positive then transistor 19 remains in the cutoff state. Prior to instant $t_1$ and after instant $t_4$ transistor 19 conducts. The voltage at terminal 5 assumes a value which is approximately 0.7 V lower than the base voltage of transistor 19, i.e. approximately zero. This is shown in FIG. 3c.

Also connected to terminal 5 is the emitter of pnp-transistor 23 whose base is supplied with pulses $S_1$, its collector being connected to the base of an npn-transistor 24. A pulse shown in FIG. 3d is present at this collector so that the function of the collector is the same as that of the electrode 7 in FIGS. 1 and 2. The reference signal $S_2$ is available at the collector of transistor 24 for further processing in the line synchronization circuits. Instead of transistor 23 it would also have been possible to provide the transistor 2' with a second collector.

In the foregoing transistor 2 or combination 2', 2" conducts during the time interval between the instants $t_1$ and $t_4$. This is caused by the pulse of FIG. 3a having an amplitude which is higher than approximately 12.7 V. In the case of said amplitude being lower than 12.7 V transistor 2 or combination 2', 2" respectively is cut-off between instants $t_2$ and $t_3$. The voltage at terminal 5 assumes a value which is approximately equal to said amplitude, so that also in this case a pulse whose edges occur at instants $t_2$ and $t_3$ is available at terminal 5.

It will be clear that variants of the circuit of FIG. 2 and FIG. 4 respectively are possible wherein the line flyback pulses are negative-going and/or transistor 2 and combination 2', 2" respectively is of the npn-type. One can also ensure that transistor 2 and combination 2', 2" respectively is cut-off after instant $t_1$ instead of being brought to the conductive state.

What is claimed is:

1. A circuit arrangement comprising a first portion included within a monolithic integrated semiconductor body, a second portion disposed outside said body, and means for deriving from said body a signal present within said first circuit portion through a connecting terminal of said body and for supplying another signal from said second circuit portion to said body through the same connecting terminal, said means comprising an amplifier disposed in one of said portions having first, second, and third terminals, said first terminal comprising an input terminal means for receiving one of the signals, said second terminal comprising an input terminal means for receiving the second signal and also an output terminal means for providing the first signal, said second terminal being connected to said connecting terminal of the semiconductor body, said third terminal comprising an output terminal means for providing the second signal.

2. A circuit arrangement as claimed in claim 1, wherein the first signal is available at a lead connected to the connecting terminal of the semiconductor body.

3. A circuit arrangement as claimed in claim 1, further comprising a first signal source means for producing the first signal, the amplifier and said source means being disposed in the first portion of the circuit, and a second signal source means for producing the second signal, disposed in the second circuit portion.

4. A circuit arrangement as claimed in claim 3, wherein the amplifier comprises a transistor means having a base electrode comprising the first terminal, an emitter electrode comprising the second terminal, the second signal source comprising a current source.

5. A circuit arrangement as claimed in claim 4, wherein the first signal source comprises a voltage source.

6. A circuit arrangement as claimed in claim 4, wherein said transistor means comprises first and second transistors of opposite conductivity type.

7. A circuit as claimed in claim 3, wherein the first and the second signals are each pulse-shaped.

8. A circuit arrangement as claimed in claim 7, wherein the amplifier comprises a transistor means having a base electrode comprising the first terminal, and an emitter electrode comprising the second terminal, said transistor means being adapted to be brought to the conducting and cut-off state respectively by the second signal.

9. A circuit arrangement as claimed in claim 8 for use in a colour television receiver, wherein the first signal comprises a pulse for keying out the colour synchronization signal, and the second signal comprises a line flyback pulse.

10. A circuit arrangement as claimed in claim 9, wherein said transistor means has a collector electrode comprising the third terminal, the signal available at said collector being a reference signal for a line synchronization circuit located in the semiconductor body.

11. A circuit arrangement as claimed in claim 8, wherein said transistor means comprises first and second transistors of opposite conductivity type.

12. A circuit arrangement as claimed in claim 1, further comprising a first signal source means for producing the first signal, the amplifier and said source means being disposed in the second portion of the circuit, and a second signal source means for producing the second signal, disposed in the first circuit portion.

13. A circuit arrangement as claimed in claim 12, wherein the amplifier comprises a transistor means having a base electrode comprising the first terminal, and an emitter electrode comprising the second terminal, the second signal source comprising a current source.

14. A circuit arrangement as claimed in claim 13, wherein the first signal source comprises a voltage source.

15. A circuit arrangement as claimed in claim 13, wherein said transistor means comprises first and second transistors of opposite conductivity type.

* * * * *